United States Patent
Yui (10) Patent No.: US 8,417,007 B2
(45) Date of Patent: Apr. 9, 2013

(54) MAGNETIC RESONANCE IMAGING APPARATUS AND MAGNETIC RESONANCE IMAGING METHOD

(75) Inventor: Masao Yui, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 810 days.

(21) Appl. No.: 12/330,949

(22) Filed: Dec. 9, 2008

(65) Prior Publication Data

US 2009/0148021 A1 Jun. 11, 2009

(30) Foreign Application Priority Data

Dec. 10, 2007 (JP) ................................. 2007-318518
Oct. 21, 2008 (JP) ................................. 2008-270946

(51) Int. Cl.
*G06T 7/00* (2006.01)
*G06T 15/00* (2011.01)

(52) U.S. Cl.
USPC .............................................. 382/131; 378/8

(58) Field of Classification Search .................. None
See application file for complete search history.

(56) References Cited

U.S. PATENT DOCUMENTS

| 4,728,890 | A * | 3/1988 | Pattany et al. | 324/309 |
| 5,251,128 | A * | 10/1993 | Crawford | 600/425 |
| 6,268,730 | B1 * | 7/2001 | Du | 324/309 |
| 6,292,684 | B1 * | 9/2001 | Du et al. | 600/410 |
| 6,586,933 | B1 * | 7/2003 | Hardy et al. | 324/307 |
| 2002/0025017 | A1 * | 2/2002 | Stergiopoulos et al. | 378/8 |
| 2002/0077546 | A1 * | 6/2002 | Aldefeld et al. | 600/424 |
| 2004/0113613 | A1 * | 6/2004 | Markl et al. | 324/306 |
| 2006/0074300 | A1 * | 4/2006 | Green | 600/427 |
| 2006/0224062 | A1 * | 10/2006 | Aggarwal et al. | 600/413 |
| 2007/0066886 | A1 * | 3/2007 | Kuhara et al. | 600/413 |
| 2007/0167705 | A1 * | 7/2007 | Chiang et al. | 600/407 |

FOREIGN PATENT DOCUMENTS

JP 2007-82753 4/2007

OTHER PUBLICATIONS

Kim, W.S., et al. "Extraction of Cardiac and Respiratory Motion Cycles by Use of Projection Data and its Applications to NMR Imaging" Magnetic Resonance in Medicine (1990) 13:25-37.*
U.S. Appl. No. 12/273,718, filed Nov. 19, 2008.

* cited by examiner

*Primary Examiner* — Hrayr A Sayadian
(74) *Attorney, Agent, or Firm* — Nixon & Vanderhye PC (57) ABSTRACT

A magnetic resonance imaging apparatus includes a data acquisition unit, a correction unit, a sorting unit and an image reconstruction unit. The data acquisition unit acquires data for imaging and projection data. The correction unit performs motion correction of the data using respiratory motion data obtained based on the projection data. The sorting unit sorts the data after motion correction into a cardiac time phase order based on electrocardiographic information. The image reconstruction unit reconstructs three-dimensional image data based on the sorted data after motion correction.

18 Claims, 6 Drawing Sheets

MAGNETIC RESONANCE IMAGING APPARATUS AND MAGNETIC RESONANCE IMAGING METHOD

BACKGROUND

1. Technical Field

The present invention relates to an MRI (magnetic resonance imaging) apparatus and a magnetic resonance imaging method which excite nuclear spins of an object magnetically with an RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which make it possible to perform 3D (three-dimensional) cine imaging of a moving part such as a heart under free breath.

2. Description of the Related Art

Magnetic Resonance Imaging is an imaging method which excites nuclear spin of an object set in a static magnetic field with a RF signal having the Larmor frequency magnetically and reconstruct an image based on an MR signal generated due to the excitation.

Conventionally, in the field of MRI, cardiac cine imaging is performed (see, for example, Japanese Patent Application Laid-Open disclosure No. 2007-82753). The MRI cardiac cine imaging uses two-dimensional (2D) imaging in synchronization with an electrocardiogram while a patient holds his/her breath for around 10 seconds. Normally, since a short axis image is obtained so that the entire left ventricle of the heart is covered, it is necessary to repeat imaging with breath-holding around 10 times. Consequently, a technology for segmenting k-space (Fourier space) data to be acquired into some regions (i.e. segmentalization) and sequentially acquiring plural pieces of k-space data each segment during a single breath-holding, that is, a technology for acquiring pieces of data with a segmented sequence is devised.

However, in conventional MRI cardiac cine imaging, there are problems in that image degradation such as image wobble occurs and a slice position is displaced in the case of an image of a patient when it is difficult to hold his/her breath. As a result, there is concern that accuracy of diagnostic, such as cardiac function analysis, decreases. In conventional MRI cardiac cine imaging, a burden for the patient also increases due to repetition of imaging with breath-holding around 10 times.

In addition, in conventional MRI cardiac cine imaging, since it is difficult to improve time resolution and spatial resolution because of constraints in a breath-holding period, three dimensional imaging is thought to be practically unrealistic.

To the contrary, under a parallel imaging method (that is one of high-speed imaging methods devised recently), time resolution and spatial resolution are improved and three-dimensional imaging is tried at the study level.

However, the situation still needs a long breath-holding time of approximately ten-seconds and, moreover, requires a partial sacrifice of resolution.

SUMMARY OF THE INVENTION

The present invention has been made in light of these conventional situations, and it is an object of the present invention to provide a magnetic resonance imaging apparatus and a magnetic resonance imaging method which make it possible to acquire a 3D cine image of a moving part such as a heart with a high resolution under free breath.

The present invention provides a magnetic resonance imaging apparatus comprising: a data acquisition unit configured to acquire plural pieces of data for imaging and plural pieces of projection data for obtaining breath levels of a patient respectively from the patient by continuously applying a radio frequency pulse train to the patient with a constant interval; a correction unit configured to perform motion correction of the plural pieces of the data using the breath levels of the patient obtained based on the plural pieces of the projection data; a sorting unit configured to sort the plural pieces of the data after the motion correction into a cardiac time phase order based on electrocardiographic information of the patient; and an image reconstruction unit configured to reconstruct three-dimensional image data based on the plural pieces of the data sorted in the cardiac time phases after the motion correction.

The present invention also provides a magnetic resonance imaging apparatus comprising: a data acquisition unit configured to acquire plural pieces of data for imaging and plural pieces of projection data for obtaining breath levels of a patient respectively from the patient by continuously applying a radio frequency pulse train to the patient with a constant interval; a sorting unit configured to sort the plural pieces of the data into a cardiac time phase order based on electrocardiographic information of the patient; a correction unit configured to perform motion correction of the plural pieces of the data sorted in the cardiac time phases using the breath levels of the patient obtained based on the plural pieces of the projection data; and an image reconstruction unit configured to reconstruct three-dimensional image data based on the plural pieces of the data sorted in the cardiac time phases after the motion correction.

The present invention also provides a magnetic resonance imaging method comprising: acquiring plural pieces of data for imaging and plural pieces of projection data for obtaining breath levels of a patient respectively from the patient by continuously applying a radio frequency pulse train to the patient with a constant interval; performing motion correction of the plural pieces of the data using the breath levels of the patient obtained based on the plural pieces of the projection data; sorting the plural pieces of the data after the motion correction into a cardiac time phase order based on electrocardiographic information of the patient; and reconstructing three-dimensional image data based on the plural pieces of the data sorted in the cardiac time phases after the motion correction.

The present invention also provides a magnetic resonance imaging method comprising: acquiring plural pieces of data for imaging and plural pieces of projection data for obtaining breath levels of an patient respectively from the patient by continuously applying a radio frequency pulse train to the patient with a constant interval; sorting the plural pieces of the data into a cardiac time phase order based on electrocardiographic information of the patient; performing motion correction of the plural pieces of the data sorted in the cardiac time phases using the breath levels of the patient obtained based on the plural pieces of the projection data; and reconstructing three-dimensional image data based on the plural pieces of the data sorted in the cardiac time phases after the motion correction.

The magnetic resonance imaging apparatus and the magnetic resonance imaging method according to the present invention as described above make it possible to acquire a 3D cine image of a moving part such as a heart with a high resolution under free breath.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
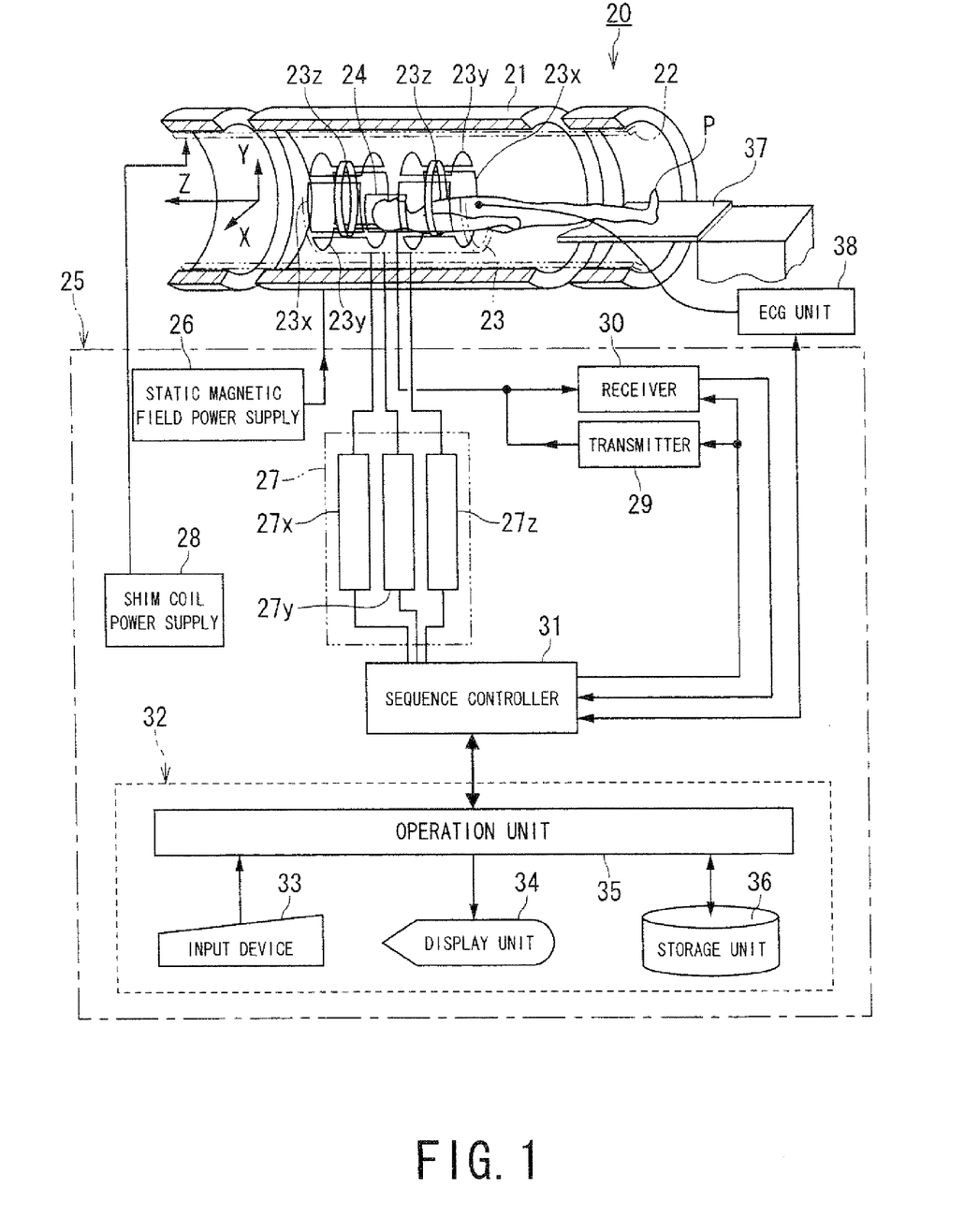
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y— axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a NMR signal generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and an RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

In addition, an ECG unit 38 for acquiring an ECG (electro cardiogram) signal of the object P is provided with the magnetic resonance imaging apparatus 20. The ECG signal detected by the ECG unit 38 is outputted to the computer 32 through the sequence controller 31.

Note that, a PPG (peripheral pulse gating) signal may be acquired instead of an ECG signal. A PPG signal is acquired by detecting a pulse wave of e.g. tip of a finger as an optical signal. When a PPG signal is acquired, a PPG signal detection unit is provided with the magnetic resonance imaging apparatus 20.

The computer 32 gets various functions by the operation unit 35 executing some programs stored in the storage unit 36 of the computer 32.

Alternatively, some specific circuits having various functions may be provided with the magnetic resonance imaging apparatus 20 instead of using some of the programs.

Figure 2:
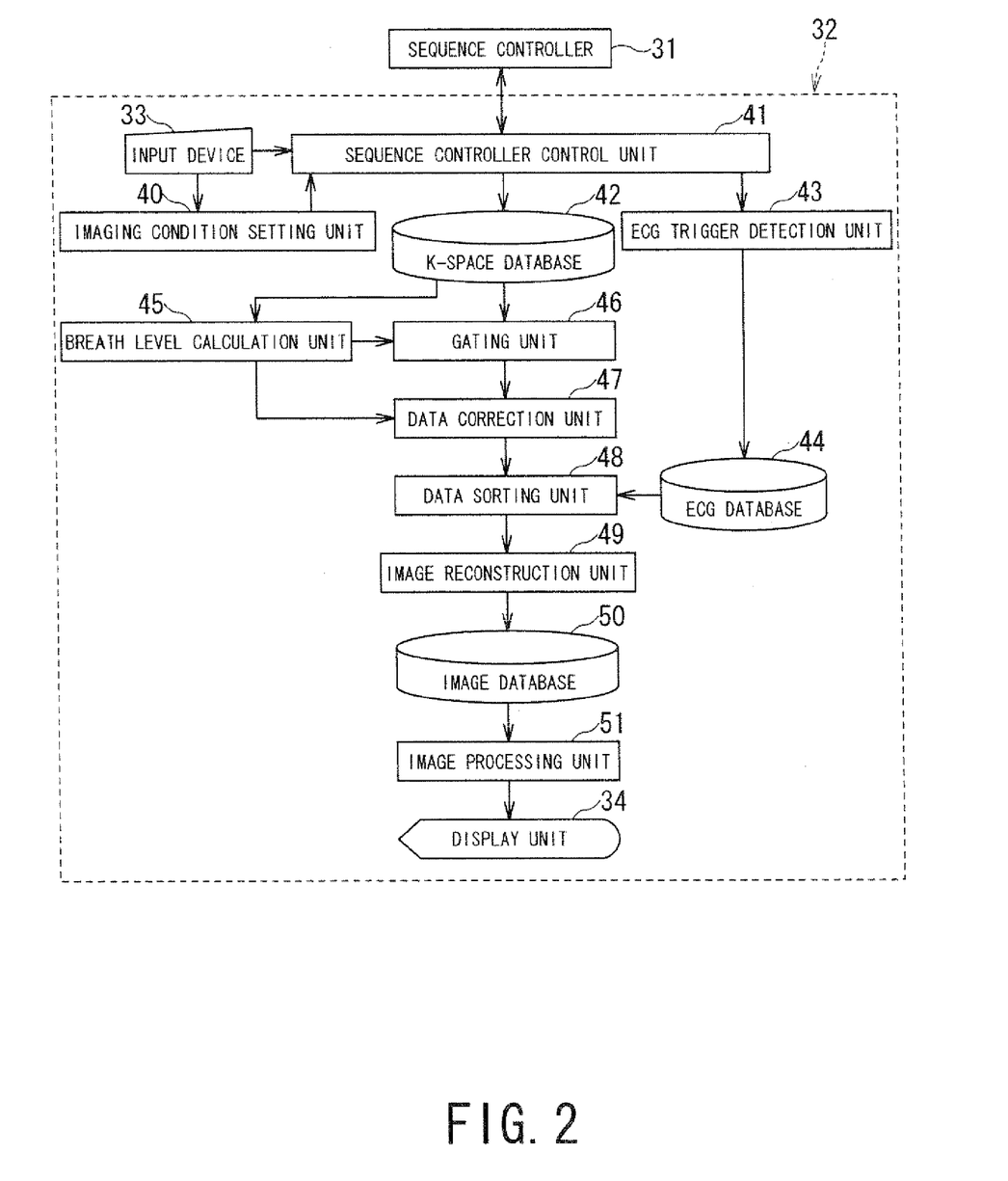
FIG. 2 is a functional block diagram of the computer shown in FIG. 1.

FIG. 2 is a functional block diagram of the computer 32 shown in FIG. 1.

The computer 32 functions as an imaging condition setting unit 40, a sequence controller control unit 41, a k-space database 42, an ECG trigger detection unit 43, an ECG database 44, a breath level calculation unit 45, a gating unit 46, a data correction unit 47, a data sorting unit 48, an image reconstruction unit 49, an image database 50 and an image processing unit 51 by program.

The imaging condition setting unit 40 has a function to set an imaging condition including a pulse sequence based on instruction information from the input device 33 and to provide the set imaging condition to the sequence controller control unit 41. For this purpose, the imaging condition setting unit 40 has a function to display screen information for setting an imaging condition on the display unit 34. Particularly, the imaging condition setting unit 40 has a function to set a pulse sequence for acquiring a 3D cine image of a moving part such as a heart with a high resolution under free breath.

Figure 3:
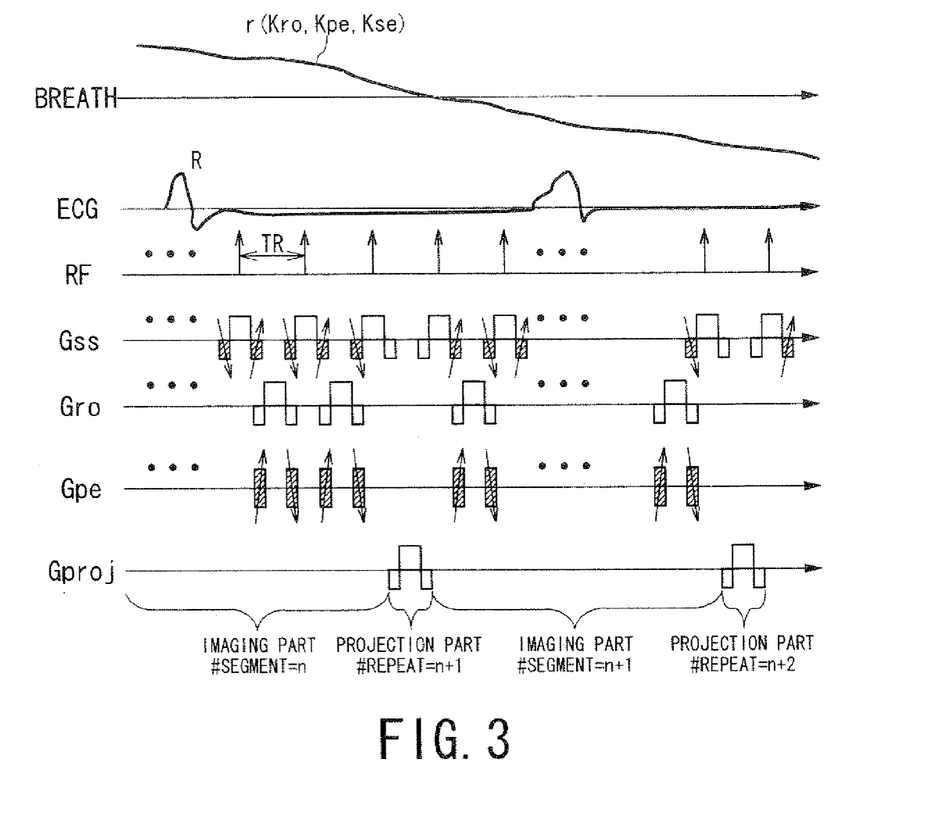
FIG. 3 is a diagram showing an example of pulse sequence set by the imaging condition setting unit shown in FIG. 2.

FIG. 3 is a diagram showing an example of pulse sequence set by the imaging condition setting unit 40 shown in FIG. 2.

In FIG. 3, BREATH denotes a motion amount of a heart due to breath shown for reference, ECG denotes an ECG signal, RF denotes RF pulses, Gss denotes gradient magnetic field pulses for slice selection (also referred as gradient magnetic field pulses for SE (slice encode)), Gro denotes gradient magnetic field pulses for RO (readout) (also referred as gradient magnetic field pulses for frequency encode), Gpe denotes gradient magnetic field pulses for PE (phase encode), and Gproj denotes gradient magnetic field pulses for frequency encode for acquiring projection data to obtain a breath level of a patient P, respectively.

The pulse sequence shown in FIG. 3 is a balanced steady-state free precession (SSFP) sequence. That is, a steady state of a magnetization is maintained by applying an RF pulse sequentially with a constant repetition time (TR) and an NMR signal occurs. Note that, a different type of a gradient echo sequence, which is different from a SSFP sequence, such as a FLASH (fast low angle shot) sequence, a FISP (fast imaging with steady-state precession) sequence or a PSIF (time reversed FISP) sequence may be used.

As shown in FIG. 3, the pulse sequence for obtaining a three dimensional cine image of a moving part under free breathing has an imaging part and a projection part. More specifically, the imaging part and the projection part are performed mutually repeatedly.

Note that, the pulse sequence is not synchronized with an ECG signal, but is performed independently. That is, the pulse sequence is not for an ECG synchronous imaging. Note that, while the pulse sequence is performed, ECG information is constantly acquired and recorded in the ECG unit 38. The acquired ECG information may be also a wave form of an ECG signal itself or time stamp information such as an R wave.

In the imaging part of the pulse sequence, a readout gradient magnetic field pulse is applied as a frequency encode pulse in one direction with phase encode pulses in two directions of a slice selection gradient magnetic field pulse Gss and a phase encode gradient magnetic field pulse Gpe. Consequently, during a readout gradient magnetic field pulse, a NMR signal is acquired as data for imaging.

The imaging part can be a sequence using a segmented k-space method in order to achieve three-dimensional imaging with a high time resolution by speeding up imaging. The segmented k-space method is a method for segmentalizing a k-space (also referred to as the Fourier space or a frequency space) by segmenting the k-space into some regions and for retrieving k-space data for each successive segment sequentially. Therefore, intensities of phase encode gradient magnetic field pulses Gpe are set to plural mutually different values for each segment and all of the data in the k-space are completed by respectively acquiring the plural pieces of data in all segments. Then, plural phase encode gradient magnetic field pulses Gpe having intensities set to multiple values corresponding to a segment are applied repeatedly at least over more than one heart rate. Hereinafter, a case where a pulse sequence is a segmented sequence using the segmented k-space method will be described.

In the example shown in FIG. 3, the pulse sequence is set so that the (n+1)-th projection part is performed subsequently to the imaging part for acquiring data in the n-th segment and the imaging part for acquiring data in the (n+1)-th segment is performed subsequently to the (n+1)-th projection part. Furthermore, after the imaging part for acquiring data in the (n+1)-th segment, the (n+2)-th projection part is performed. As described above, the N imaging parts respectively corresponding to the N segments and the projection parts set between adjacent imaging parts are performed sequentially and alternatively.

Further, a section including an imaging target is excited selectively by applying a slice selection gradient magnetic field pulse Gss in an imaging part. In the example shown in FIG. 3, the slice selection gradient magnetic field pulses Gss are applied at the same timings as those of the RF pulses.

Meanwhile, in each projection part, a frequency encode gradient magnetic field pulse Gproj for acquiring projection data for obtaining a breath level of an object P is applied in the same direction as a direction of a breath motion or in a direction that is near a direction of a breath motion. Then, NMR signals are acquired as the projection data for obtaining the breath level of the object P by applying the frequency encode gradient magnetic field pulse Gproj for acquiring the projection data.

Further, each projection part is performed under the condition that a slice is selected with the slice selection gradient magnetic field pulse Gss in each imaging part. That is, the pulse sequence is set so that a slice selection gradient magnetic field pulse Gss is shared between an imaging part and a projection part and the projection part is performed under the condition selecting the slice selected at the last in the imaging part just before the projection part. Therefore, as shown in FIG. 3, in a case of using a SSFP sequence, a steady state of magnetization can be also maintained in each projection part.

In addition, each projection part is performed under the state excited by applying the RF pulses in each imaging part. That is, the pulse sequence is set so that a RF pulse is also shared between an imaging part and a projection part and the projection part is performed under the excitation state by applying the last RF pulse in the imaging part just before the projection part. Then, the RF pulses in the imaging parts and the projection parts are applied at a constant repetition time and the steady state is maintained. Consequently, a vain spare time is not set between an imaging part and a projection part.

Figure 4:
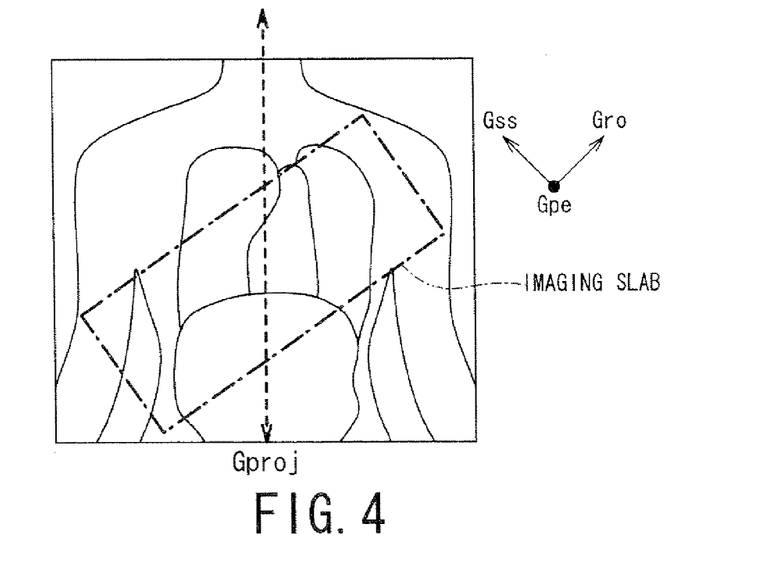
FIG. 4 is a diagram showing an example of setting slices selected in the imaging parts and the projection parts and an application direction of gradient magnetic field pulses Gproj for frequency encode for acquiring projection data of the pulse sequence shown in FIG. 3.

FIG. 4 is a diagram showing an example of setting slices selected in the imaging parts and the projection parts and an application direction of gradient magnetic field pulses Gproj for frequency encode for acquiring projection data of the pulse sequence shown in FIG. 3.

FIG. 4 shows a typical imaging section set in a case of imaging a heart of an object P and directions of the respective gradient magnetic field pulses. In the case of imaging the heart of the object P, a volume including a heart is set to an imaging slab in an imaging plan. Then, the imaging slab is set on a short axis section including a cardiac left ventricle.

Therefore, the slice selection gradient magnetic field pulses Gss are set in a direction perpendicular to the cardiac short axis section, the readout gradient magnetic field pulses Gro in each imaging part are set in the cardiac short axis direction and the phase encode gradient magnetic field pulses Gpe are set in the direction perpendicular to both the application direction of the slice selection gradient magnetic field pulses Gss and the application direction of the readout gradient magnetic field pulses Gro respectively.

Meanwhile, the frequency encode gradient magnetic field pulses Gproj for acquisition of the projection data are applied in the same direction as a direction of a breath motion or in a direction which is near a direction of a breath motion. Therefore, in the example shown in FIG. 4, the application direction of the frequency encode gradient magnetic field pulses Gproj for acquisition of the projection data is set in the body axis direction of the object P. For this reason, the respective application directions of the readout gradient magnetic field pulses Gro in the imaging parts and the frequency encode gradient magnetic field pulses Gproj for acquisition of the projection data in the projection parts become different mutually. On the contrary, a slice selection gradient magnetic field pulse Gss and a RF pulse are shared between an imaging part and a projection part. Therefore, between the imaging parts and the projection parts, conditions including application timings of the slice selection gradient magnetic field pulses Gss and the RF pulses are same.

Then, the imaging condition including the pulse sequence set as described above is configured to be provided from the imaging condition setting unit 40 to the sequence controller control unit 41.

The sequence controller control unit 41 has a function for controlling the driving of the sequence controller 31 by giving an imaging condition including a pulse sequence to the sequence controller 31 according to information instructing imaging start from the input device 33. In addition, the sequence controller control unit 41 has a function for receiving raw data from the sequence controller 31 and storing the raw data in the k-space database 42.

Therefore, the k-space database 42 stores the pieces of raw data generated by the receiver 30 as pieces of k space data. That is, pieces of imaging data corresponding to plural segments and pieces of projection data for obtaining breath levels of an object P, which are acquired by performing a pulse sequence set in the imaging condition setting unit 40, are sequentially written and stored in the k-space database 42.

The ECG trigger detection unit 43 has a function to obtain an ECG signal obtained separately from the ECG unit 38 during data acquisition by performing a pulse sequence through the sequence controller 31 and the sequence controller control unit 41 and to detect a trigger signal based on ECG information such as an R wave from the obtained ECG signal. Note that, the ECG unit 38 may be configured to detect a trigger signal based on ECG information such as an R wave. In this case, the trigger signal based on ECG information detected in the ECG unit 38 are obtained in the ECG trigger detection unit 43 through the sequence controller 31 and the sequence controller control unit 41. Then, the ECG trigger detection unit 43 is configured to write the obtained trigger signal base on the ECG information into the ECG database 44.

Therefore, in the ECG database 44, the trigger signal based on the ECG information acquired during data acquisition by performing a pulse sequence is stored.

The breath level calculation unit 45 has a function to read time-series plural pieces of projection data, acquired intermittently by performing the projection parts of the pulse sequence, from the k space database 42 and to calculate breath levels of the object P at the timings, at which the pieces of k-space data in N segments n (n=1, 2, 3, . . . , N) are acquired, based on the read time-series plural pieces of the projection data.

Specifically, plural pieces of projection data, in the real space, representing respiratory motions can be generated by performing FT (Fourier transform) of time-series plural pieces of projection data in a readout direction respectively. Then, a motion amount due to breath of imaging part such as a heart of the object P at the timing, at which each piece of the projection data is acquired, can be obtained by reference of the pieces of the projection data. The motion amount due to breath at the imaging part of the object P can be obtained as a relative displacement of the imaging part from a certain reference position. The methods for obtaining a relative displacement of an imaging part from a reference position, for example, includes a method for obtaining a relative position shift amount by calculating a cross correlation between a piece of the projection data corresponding to the reference position and a piece of projection data which is a target for obtaining the relative displacement.

Since the respective pieces of the projection data are acquired respectively corresponding to the segments n before or after the segment n, the timings at which the respective pieces of the projection data are acquired can be regarded as the timings at which the corresponding segments n are acquired respectively. Therefore, a breath level at timing at which each piece of the projection data is acquired, i.e. a motion amount due to breath can be regarded as a motion amount at timing at which plural peaces of k-space data in the corresponding segment n are acquired.

Note that, breath level data, at a timing at which each piece of the projection data is acquired, corresponds to breath level data before and after timing at which plural pieces of k-space data in each segment n are acquired. Therefore, when the breath level data is interpolated by calculating average values or interpolation values between the pieces of breath level data at the timings at which the respective pieces of the projection data are acquired, a breath level r(Kro, Kpe, Kse) at timing, at which a piece of k-space data S(Kro, Kpe, Kse) at an arbitrary position k(Kro, Kpe, Kse) in each segment n is acquired, can be calculated with higher accuracy. That is, time variation in the breath level of the object P can be calculated.

The gating unit 46 functions as needed. Then, the gating unit 46 has a function to read pieces of the k-space data S(Kro, Kpe, Kse), at positions k(Kro, Kpe, Kse) in each segment n acquired by performing the imaging parts of the pulse sequence, from the k-space database 42 and to provide only pieces of the k-space data S(Kro, Kpe, Kse) except pieces of the k-space data acquired in a condition in which a motion amount due breath or a breath level r(Kro, Kpe, Kse) is out of a range defined by a predetermined threshold, to the data correction unit 47, by applying gating to the read pieces of the k-space data S(Kro, Kpe, Kse) based on a breath level r(Kro, Kpe, Kse), of timing at which each piece of k-space data S(Kro, Kpe, Kse) is acquired, calculated in the breath level calculation unit 45.

By the gating unit 46, pieces of the k-space data S(Kro, Kpe, Kse) except pieces of the k-space data which is inappropriate to be used for generating cine image data because of a large motion amount by free breathing of the object P are extracted and the extracted pieces of the k-space data S(Kro, Kpe, Kse) can be provided to the data correction unit 47 for generating cine image data selectively.

The data correction unit 47 has a function to obtain pieces of k-space data S' (Kro, Kpe, Kse) after motion correction by performing the motion correction, with using the pieces of the breath level data r(Kro, Kpe, Kse) of the object P respectively corresponding to the respective pieces of the k-space data S(Kro, Kpe, Kse) obtained from the breath level calculation unit 45, to the pieces of the k-space data S(Kro, Kpe, Kse) extracted by the gating unit 46 or the pieces of the k-space data S(Kro, Kpe, Kse) acquired by performing the imaging parts and read from the gating unit 46. That is, the pieces of the k-space data S(Kro, Kpe, Kse) in each segment n are subjected to the motion correction with the pieces of the breath level data r(Kro, Kpe, Kse) calculated based on the pieces of the projection data acquired corresponding to the respective segments n.

An expression for converting the pieces of the k-space data S(Kro, Kpe, Kse) before the motion correction into the pieces of the k-space data S'(Kro, Kpe, Kse) after the motion correction by the motion correction of the pieces of the k-space data S(Kro, Kpe, Kse) before the motion correction with using the pieces of the breath level data r(Kro, Kpe, Kse) can be represented as the expression (1).

$$S'(Kro,Kpe,Kse)=S(Kro,Kpe,Kse) \times \exp[-I \times (Gro \cdot Gproj) \times Kro \times \{r(Kro,Kpe,Kse)-r0\}/FOVro] \times \exp[-I \times (Gpe \cdot Gproj) \times Kpe \times \{r(Kro,Kpe,Kse)-r0\}/FOVpe] \times \exp[-I \times (Gse \cdot Gproj) \times Kse \times \{r(Kro,Kpe,Kse)-r0\}/FOVse] \quad (1)$$

In the expression (1), FOVro, FOVpe and FOVse are fields of view (FOVs) in a frequency encode direction, in a phase encode direction and in a slice encode direction respectively; r0 is a reference level of a breath level. Further, the sign "·" represents inner product.

By the motion correction with the expression (1) as described above, plural time-series pieces of the k-space data S' (Kro, Kpe, Kse) in each segment n after the motion correction respectively become equivalent to pieces of k-space data acquired from the imaging part in a state where the imaging part is fixed to the reference level. That is, the imaging part moves in a slab due to breath practically, however, can be treated as a thing fixed on the reference level.

The data sorting unit 48 has a function to obtain trigger signals based on the ECG information from the ECG database 44, to obtain the time-series pieces of the k-space data S' (Kro, Kpe, Kse) every segment n after the motion correction from the data correction unit 47, to relate the pieces of the k-space data S' (Kro, Kpe, Kse) after the motion correction with cardiac time phases based on the trigger signals based on the ECG information, each data acquisition time of the time-series pieces of the k-space data S' (Kro, Kpe, Kse) after the motion correction and each acquisition time of the trigger signals and to sort the respective pieces of the k-space data S' (Kro, Kpe, Kse), after the motion correction, related with the cardiac time phases in the cardiac time phase order. The pieces of k-space data after the motion correction are arranged at plural respective positions in plural k-spaces corresponding to cardiac time phases of the heart respectively.

Figure 5:
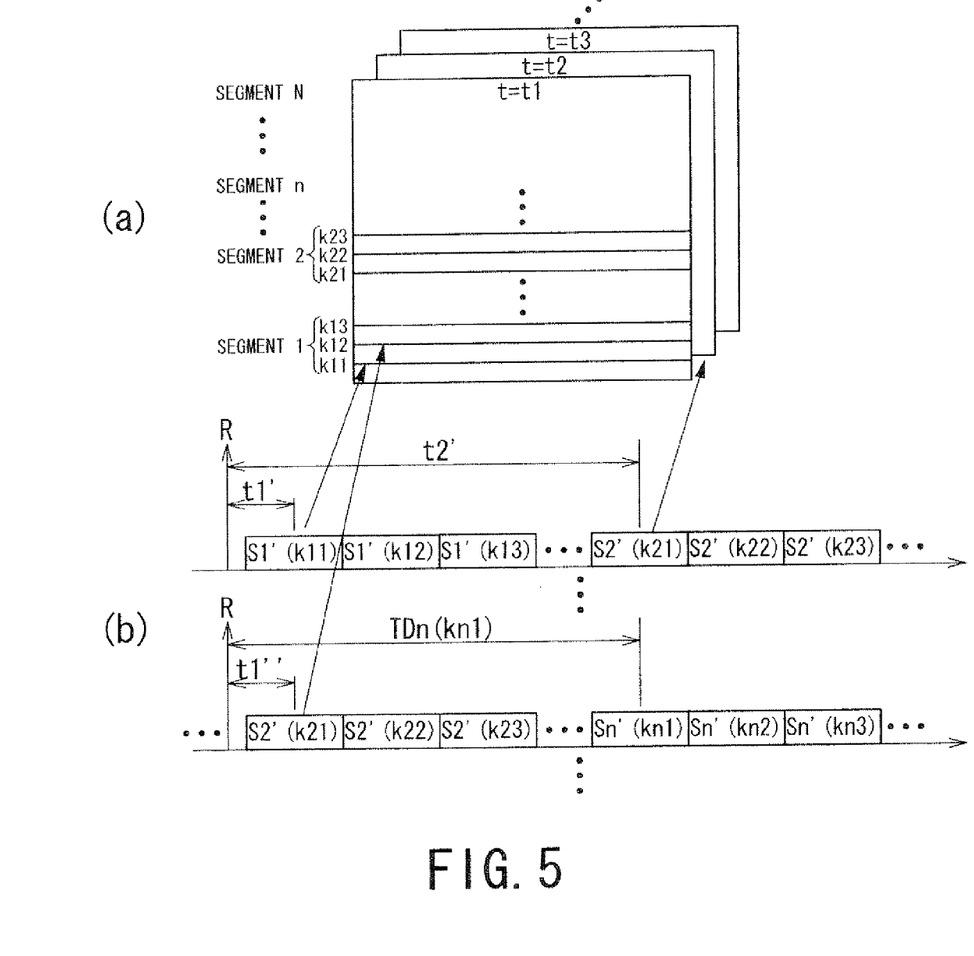
FIG. 5 is a diagram explaining a method for sorting pieces of k space data by the data sorting unit shown in FIG. 2 after motion correction.

FIG. 5 is a diagram explaining a method for sorting pieces of k space data by the data sorting unit 48 shown in FIG. 2 after motion correction.

FIG. 5(a) shows time-series k-spaces used for generating cine image data and k-space data trains arranged on each k-space. As shown in FIG. 5(a), pieces of k-space data on each of the k-spaces corresponding to respective cardiac time phases t=t1, t2, t3, . . . are necessary for generating the cine image data. Note that, in FIG. 5(a), the k-space data is shown two-dimensionally, however, k-space data for plural slices are necessary practically. Further, since the pulse sequence is the segmented sequence, each k-space is segmented into N segments n (n=1, 2, 3, . . . , N). Then, plural k-space data trains after the motion correction at respective positions k=kn1, kn2, kn3, . . . in each segment n are arranged on each k-space sequentially.

Note that, in FIG. 5(a), segmentation of k-space is an example, there are arbitrary segmentation methods.

FIG. 5(b) is a chart showing an example of relating the pieces of the k-space data Sn'{k(Kro, Kpe, Kse)} after the motion correction acquired separately to each segment n in asynchronization with an ECG signal by performing the imaging parts of the pulse sequence with cardiac time phases. That is, the time-series pieces of k-space data Sn'(k) after the motion correction can be related with the cardiac time phases by obtaining a delay time TDn(k) from an acquisition time of a trigger signal such as an R wave, of each acquisition time of the pieces of the k-space data Sn(k) at respective positions k in each segment n. Consequently, as shown in FIG. 5(b), acquisition timing of each piece of the k-space data Sn'(k) after the motion correction can be related with timing of an R wave.

As shown in FIG. 5(b), since the pieces of the k-space data Sn' (k) are acquired separately to each segment n in asynchronization with an ECG signal sequentially, time-series pieces of k-space data Sn'(k) at a same position k in the segments n of the k-spaces are not always acquired at a same cardiac time phase t=t1, t2, t3, . . . . For example, when the piece of k-space data S' (k21) at the position k21 in the segment n=2 is acquired at the cardiac time phase t2' near the cardiac time phase t2 after the piece of k-space data S1' (k11) at the position k11 in the segment n=1 is acquired at the cardiac time phase t1' near the cardiac time phase t1, the piece of k-space data S' (k11) at the position k11 in the segment n=1 acquired at the cardiac time phase t1' is used as a piece of original data for cine image data at the cardiac time phase t1 and the piece of k-space data S1' (k21) at the position k21 in the segment n=2 acquired at the cardiac time phase t2' is used as a piece of original data for cine image data of the cardiac time phase t2. Meanwhile, the piece of k-space data S1' (k21) at the position k21 in the segment n=2 acquired at the cardiac time phase t1" near the cardiac time phase t1 at another data acquisition timing is used as a piece of original data for cine image data of the cardiac time phase t1.

Therefore, when pieces of k-space data Sn' (k) after the motion correction at a position k of a certain segment n in a k-space are sorted in the cardiac time phase t order, a piece of k-space data Sn' (k) after the motion correction at the earliest cardiac time phase can be used as a piece of original data for cine image data of the cardiac time phase t1 and a piece of k-space data Sn' (k) after the motion correction at the second earliest cardiac time phase can be used as a piece of original data for cine image data of the cardiac time phase t2. Further, similarly, pieces of k-space data Sn' (k) after the motion correction can be used as pieces of original data for cine image data of corresponding cardiac time phases in the cardiac time phase order. That is, a k-space data group Sn' (k)

(n=1, 2, 3, ..., N; k=k11, k12, k13, ..., k21, k22, k23, ..., k31, k32, k33, kn1, kn2, kn3, ..., kN1, kN2, kN3, ...), after the motion correction, related to the earliest cardiac time phase at the positions k in the respective segments n of the respective k-spaces becomes original data for cine image data of the earliest cardiac time phase t1. Similarly, all k-space data groups Sn' (k) after the motion correction become original data for cine image data of the corresponding cardiac time phases t in the cardiac time phase order.

The image reconstruction unit 49 has a function for reconstructing pieces of image data, which is pieces of real space data, corresponding to the respective cardiac time phases of an object P from pieces of k-space data by sequentially capturing the pieces of k-space data, in the cardiac time phase order, after the motion correction and the sort from the data sorting unit 48 and performing image reconstruction processing including FT of the pieces of k-space data, and writing the pieces of image data in time series, corresponding to the respective cardiac time phases, generated by reconstruction, into the image database 50.

Consequently, the image database 50 stores the image data reconstructed in the image reconstruction unit 49. The stored image data is 3D cine image data since the stored image data is data acquired by a 3D pulse sequence for acquiring a 3D cine image of a moving part such as a heart set in the imaging condition setting unit 40.

The image processing unit 51 has a function for generating 2D cine image data for displaying by performing image processing such as MIP (Maximum Intensity Projection) processing and MPR (multi-planar reconstruction) processing of 3D cine image data read from the image database 50 and cine-displaying the generated cine image data for displaying on the display unit 34.

Then, the operation and action of a magnetic resonance imaging apparatus 20 will be described.

Figure 6:
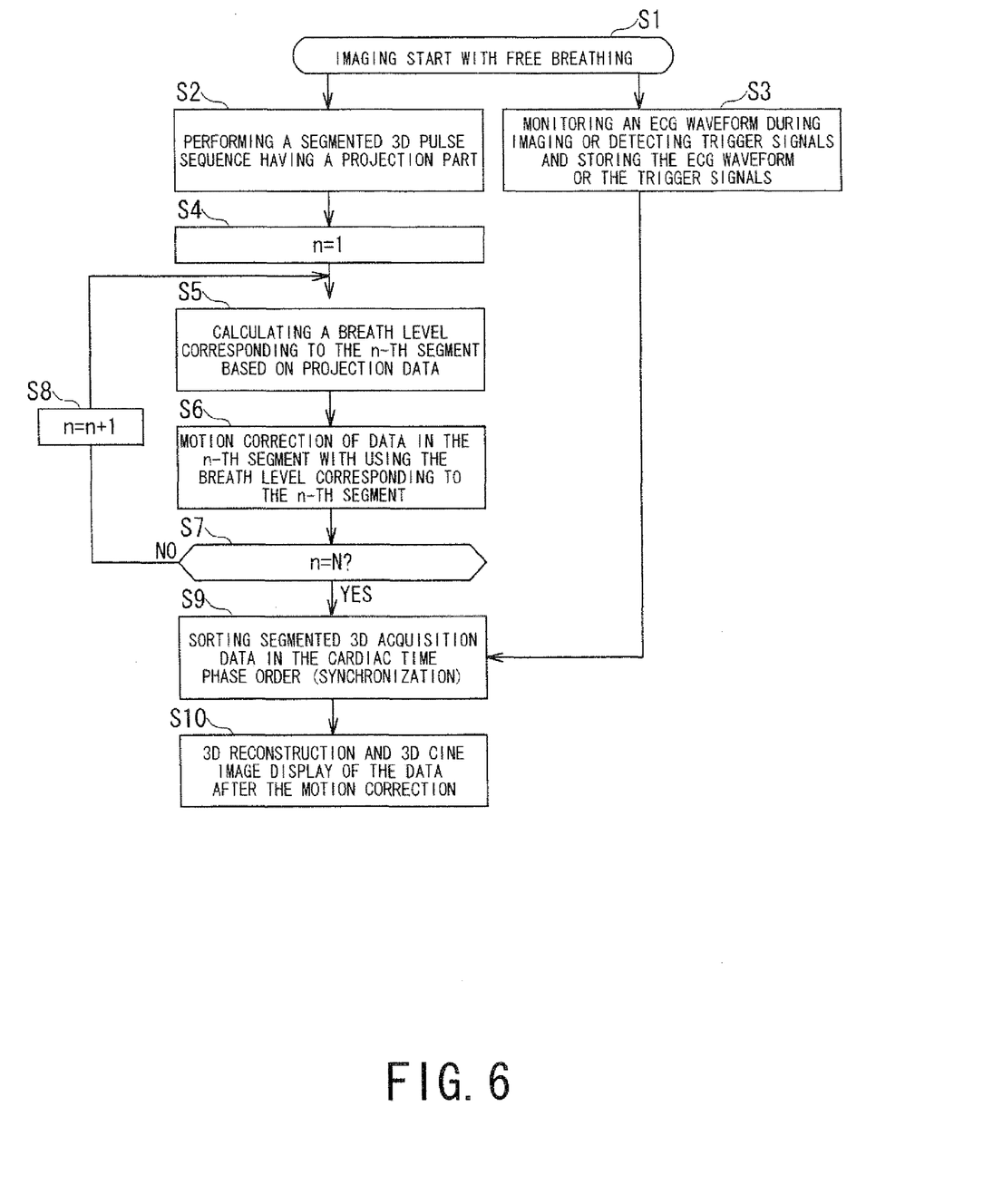
FIG. 6 is a flowchart showing a procedure of acquiring a 3D cine image of a heart of an object under free breath by the magnetic resonance imaging apparatus shown in FIG. 1.

FIG. 6 is a flowchart showing a procedure of acquiring a 3D cine image of a heart of an object P under free breath by the magnetic resonance imaging apparatus 20 shown in FIG. 1. The symbols including S with a number in FIG. 6 indicate each step of the flowchart.

Firstly, in step S1, a pulse sequence is set by the imaging condition setting unit 40 and imaging starts under free breath according to the set pulse sequence.

For that purpose, the object P is set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

By operating the input device 33 through a screen for setting an imaging condition displayed on the display unit 34, selection information of a segmented 3D pulse sequence having the imaging parts and the projection parts as shown in FIG. 3 is provided to the imaging condition setting unit 40 and the selected segmented 3D pulse sequence is set as the imaging condition in the imaging condition setting unit 40. At this time, as shown in FIG. 4, an application direction of the readout gradient magnetic field pulses Gro in the imaging parts is set in the cardiac short axis direction through the screen for setting an imaging condition and an application direction of the frequency encode gradient magnetic field pulses Gproj for acquisition of the projection data is set in the body axis direction of the object P.

Then, instruction for imaging start of a 3D cine image of the heart of the object P with using the segmented 3D pulse sequence is provided to the sequence controller control unit 41 from the input device 33.

Then, in step S2, under free breathing of the object P, the segmented 3D pulse sequence having the projection parts is performed and segmented time-series pieces of k-space data and time-series pieces of projection data respectively corresponding to the respective segments are acquired sequentially.

Specifically, the sequence controller control unit 41 supplies a segmented 3D pulse sequence having imaging parts and projection parts received from the imaging condition setting unit 40 to the sequence controller 31. Therefore, the sequence controller 31 drives the gradient power supply 27, the transmitter 29, and the receiver 30 in accordance with the segmented 3D pulse sequence received from the sequence controller control unit 41, thereby generating a gradient magnetic field in the imaging area having the set object P, and further generating RF excitation pulse signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 41. The sequence controller control unit 41 writes the raw data as k-space data in the k-space database 42.

Here, since the k-space data is acquired by the segmented 3D pulse sequence, pieces of the k-space data separately for each segment are stored in the k-space database 42.

Meanwhile, in step S3, a wave form of an ECG signal of the object P during imaging is monitored by the ECG unit 38. Here, the ECG unit 38 detects trigger signals based on ECG information such as R waves from the acquired ECG signal as needed. Then, the acquired ECG signal or the trigger signals are provided to the ECG trigger detection unit 43 through the sequence controller 31 and the sequence controller control unit 41. Then, when not trigger signals but the ECG signal is provided to the ECG trigger detection unit 43, trigger signals based on the ECG information such as R waves are detected in the ECG trigger detection unit 43. In addition, the obtained trigger signals based on the ECG information are written from the ECG trigger detection unit 43 to the ECG database 44 and stored in the ECG database 44.

Next, calculation of motion amounts of the object P at acquisition timings of the pieces of the k-space data in each segment n and motion correction of the pieces of the k-space data in each segment n based on the motion amounts are performed.

For that purpose, in step S4, one is substituted for n so that the first segment n=1 is selected.

Next, in step S5, breath levels of the object P at timings at which the respective pieces of the k-space data in the first segment n=1 are acquired is calculated based on the projection data.

Specifically, the breath level calculation unit 45 reads the plural time-series pieces of the projection data acquired intermittently by performing the projection parts of the pulse sequence from the k-space database 42 and generates time-series pieces of projection data, in the real space, indicating respiratory motions by FT of the read pieces of the projection data in the readout direction. Then, by calculating a cross-correlation between each of the plural time-series pieces of projection data acquired at the respective times and a piece of projection data acquired at a time when the imaging part is at a reference position, relative displacements from the reference position of the imaging part at the respective times when the pieces of the projection data are acquired, i.e. before and after timings when the pieces of the k-space data in each segment n are acquired can be obtained as breath levels. Additionally, by interpolating the obtained time-series pieces of the breath level data of the object P with using average values or interpolation values, a breath level of the object P at an arbitrary time can be calculated.

Therefore, breath levels of the object P at respective times when the respective pieces of the k-space data in the first segment n=1 are acquired can be obtained.

Next, in step S6, motion correction of each piece of the k-space data is performed with using the breath levels of the object P at the respective times when the respective pieces of the k-space data are acquired in the first segment n=1 in the data correction unit 47. That is, the respective pieces of the k-space data in the first segment n=1 before the motion correction are respectively converted into pieces of k-space data after the motion correction by the motion correction based on the breath levels. The conversion processing for the motion correction can be expressed as the expression (1) as mentioned above.

Note that, when a piece of k-space data acquired at each timing when a motion due to breath of the object P becomes large is not used as a piece of original data for generating cine image data, gating processing for excluding pieces of k-space data each corresponding to a breath level beyond a range defined by a predetermined threshold set to the breath level can be performed in the gating unit 46 previously to the motion correction. In this case, pieces of k-space data extracted by gating processing are set to targets of the motion correction.

Then, the pieces of the k-space data in the first segment become equivalent to those acquired in a condition where an imaging target, moving actually due to a breath in an imaging slab, is fixed at the reference level, by the motion correction described above.

Next, in step S7, whether a segment n which was a target of the motion correction is the last segment N or not is determined. When the segment is not the last segment N, in step S8, n+1 is substituted for n so that the next segment n is selected. Then, calculation of breath levels and motion correction based on the breath levels in step S5 and step S6 are performed as to the next segment n again. By performing the processing like this from the segment 1 to the segment N repeatedly, the motion correction of the pieces of the k-space data in all segments n is performed.

When the motion correction as to the last segment N is completed, the segment n which was a target of the motion correction in step S7 is determined as the last segment N.

Then, in step S9, 3D k-space data in the respective segments after the motion correction is sorted in the cardiac time phase order in the data sorting unit 48.

For this purpose, the segmented time-series pieces of 3D k-space data after the motion correction is synchronized with the ECG signal based on trigger signals based on the ECG signal. That is, the data sorting unit 48 acquires the ECG trigger signals related to acquisition times from the ECG database 44.

Next, the data sorting unit 48 obtains respective delay times from the ECG trigger signal of the times when the respective pieces of the k-space data were acquired. The obtained each delay time is related to the corresponding piece of the k-space data after the motion correction as a cardiac time phase. Then, all pieces of k-space data in all segments n are related to the cardiac time phases and cardiac time phase information of the respective pieces of the k-space data Sn' (k) after the motion correction as shown in FIG. 5(b) is obtained.

Next, the data sorting unit 48 sorts the pieces of the k-space data after the motion correction in the cardiac time phase order by sorting the pieces of the k-space data, after the motion correction, corresponded to the cardiac time phases. Consequently, a set of the pieces of the k-space data, after the motion correction, separately for each cardiac time phase as shown in FIG. 5(a) is obtained. Although plural slices are not shown in FIG. 5(a), since the k-space data after the motion correction is acquired by a 3D sequence, the k-space data is obtained as to the plural slices. Then, the 3D acquisition data separately for each cardiac time phase after sorting and the motion correction is stored as original data for generating 3D cine image data.

Subsequently, in step S10, the image reconstruction unit 49 performs image reconstruction processing of the pieces of 3D acquired data, corresponding to the respective cardiac time phases, after the motion correction and the sort. This allows generating 3D cine image data of a heart of an object P. The generated 3D cine image data is written in the image database 50.

Subsequently, the image processing unit 51 reads the 3D cine image data form the image database 50 and performs image processing such as MIP processing and MPR processing of the read. 3D cine image data, thereby generating 2D cine image data for displaying. The generated 2D cine image data for displaying is output and displayed to and on the display unit 34. Consequently, a user can observe the cine image, of the heart of the object P, generated based on data having been acquired under free breath.

That is to say, the magnetic resonance imaging apparatus 20 as mentioned above is an apparatus which acquires data for plural time phases with ECG asynchronous under free breathing by a pulse sequences such as a 3D segmented sequence which has projection parts acquiring projection data for detecting breath levels of an object P and reconstructs cine image data of a moving part such as a heart by sorting the data in the cardiac time phase order with using trigger signals based on separately obtained ECG information after motion correction of the data with using breath levels calculated base on the projection data.

Therefore, by the magnetic resonance imaging apparatus 20, a 3D cine image of a moving part such as a heart can be acquired with high time resolution and high spatial resolution under free breathing by monitoring and correcting a motion amount due to breath. This makes it possible to resolutionize a 3D cine image highly and to exclude an irregular heartbeat.

Note that, though the flowchart shown in FIG. 6 shows the example of performing motion correction and sorting of imaging data after acquisition of the projection data and the imaging data by performing a pulse sequence, the motion correction and the sorting of the imaging data can be also performed in parallel with data acquisition in real time during the acquisition of the projection data and the imaging data, i.e. during imaging.

Further, though the flowchart shown in FIG. 6 shows the example of performing sort of k-space data in the cardiac time phase order after motion correction of the k-space data, the motion correction of the k-space data may be performed after sorting the k-space data in the cardiac time phase order.

Figure 7:
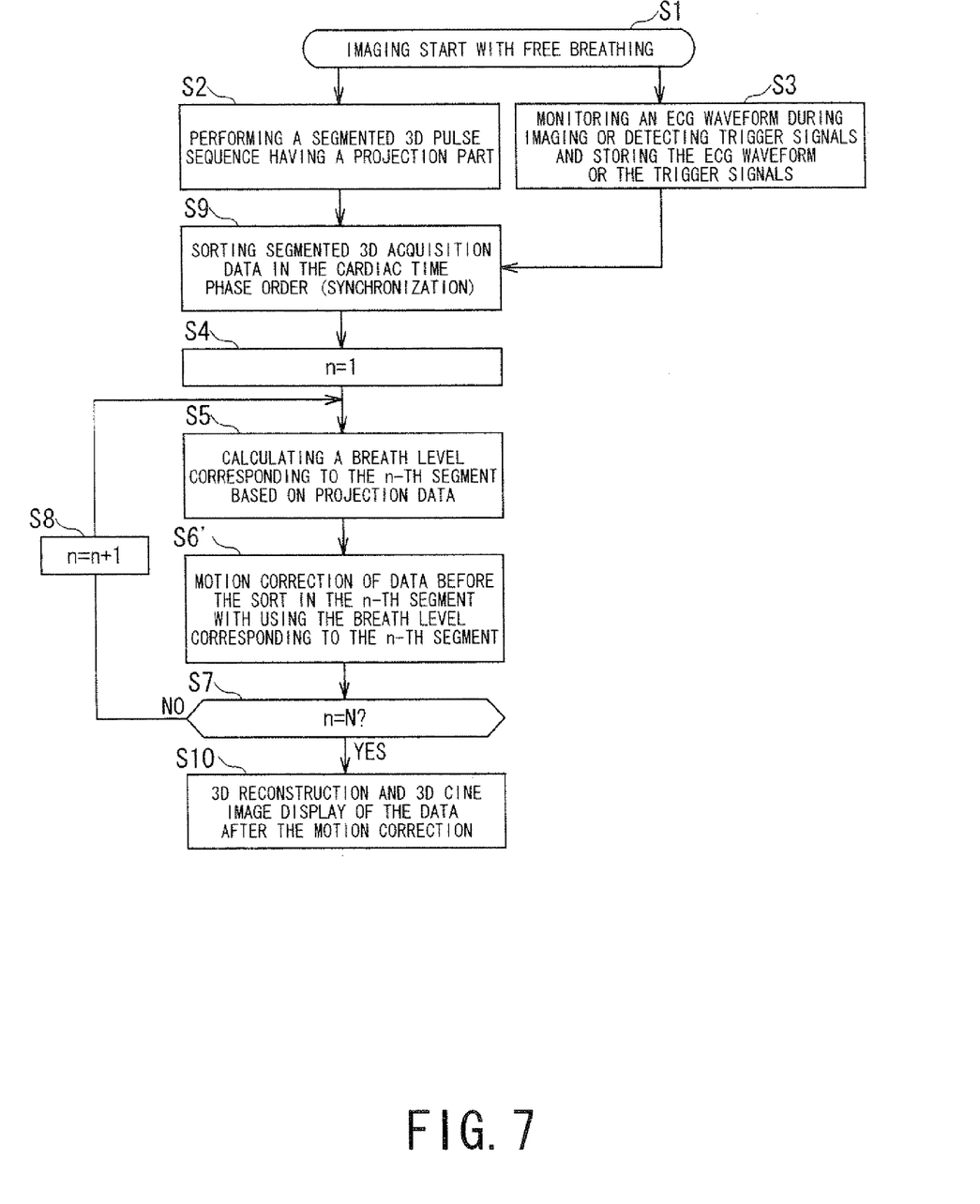
FIG. 7 is a flowchart showing a procedure of 3D cine imaging with motion correction of k space data after sorting the k space data into the cardiac time phase order by the magnetic resonance imaging apparatus shown in FIG. 1.

FIG. 7 is a flowchart showing a procedure of 3D cine imaging with motion correction of k space data after sorting the k space data into the cardiac time phase order by the magnetic resonance imaging apparatus 20 shown in FIG. 1.

The symbols including S with a number in FIG. 7 indicate each step of the flowchart. Note that, explanation of a step in FIG. 7 equivalent to that in FIG. 6 is omitted with attaching the same sign.

When the motion correction of the k-space data is performed after sorting the k-space data in the cardiac time phase order, after acquiring the k-space data and the projection data by performing the segmented 3D pulse sequence in step S2, the acquired pieces of 3D k-space data for the respective segments are sorted in the cardiac time phase order by the data sorting unit 48 in step S9.

Then, after sorting the k-space data, the motion correction of the pieces of the k-space data sorted in step S4 to step S8 is performed. Note that, while the projection data is time-series data, the k-space data to be a target of the motion correction has been sorted and the pieces of the k-space data in the n-th segment are not the time-series k-space data as acquired. Therefore, in step S6', based on the data corresponding information before and after the sorting of the k-space data, the motion correction of the k-space data in the n-th segment before the sorting is performed based on the breath levels calculated based on the projection data as to the corresponding segment.

Therefore, if the k-space data is sorted after the motion correction of the k-space data as the procedure of the flowchart shown in FIG. 6, a data processing amount can be reduced since synchronization processing and sorting processing of the k-space data which is not used as original data of cine image data by gating processing are unnecessary. Consequently, a real time extent in the motion correction processing and the sorting processing after the motion correction of the imaging data is improved, performing the motion correction and/or the sorting of the imaging data in parallel with the data acquisition in real time during imaging becomes facile as described above.

When the pulse sequence is a sequence for radial acquisition or a sequence according to the PROPELLER (periodically rotated overlapping parallel lines with enhanced reconstruction) method in which the k-space data in the frequency region is acquired and filled in a nonorthogonal state by rotating a zonary region, referred as a blade, formed by plural parallel data acquisition loci every repetition time, time-series projection data representing a heart rate motion can be obtained by performing FT of the k-space data acquired by performing the sequence. Therefore, when data acquisition is performed with using a pulse sequence which can obtain projection data indicating ECG information such as a heart rate motion, it is possible to detect trigger signals based on ECG information from the projection data having a periodicity similar to that of an ECG signal without acquiring an ECG signal or a PPG signal. That is, ECG information can be detected from time phases at which respective pieces of the projection data are acquired and a trigger signal can be set based on the detected ECG information. In this case, it is only necessary to provide a function to read the acquired k-space data from the k-space database 42 and a function to generate projection data representing ECG information from the k-space data and detect the ECG information from the projection data as described above with the ECG trigger detection unit 43 in the computer 32.

Further, the pulse sequence can be a slice nonselective radial acquisition 3D sequence. In this case, the radial acquisition 3D sequence acquires plural pieces of projection data for imaging and plural pieces of projection data for obtaining breath levels. In addition, since both pieces of data for imaging and for detecting breath levels are projection data, projection data in a same direction may be shared for imaging and detecting breath levels.

What is claimed is:

1. A magnetic resonance imaging apparatus comprising:
a data acquisition unit configured to acquire from a patient plural pieces of data for imaging and plural pieces of projection data used to obtain respectively corresponding data related to respiratory motion of the patient by continuously applying a radio frequency pulse train to the patient, said pulse train having a constant repetition time (TR) interval, and both the plural data for imaging and the plural pieces of projection data being acquired asynchronously with cardiac time phase;
a correction unit configured to perform motion correction of the plural pieces of data for imaging using the respiratory motion-related data obtained based on the plural pieces of projection data;
a data sorting unit configured to sort the plural pieces of data for imaging after motion correction into a cardiac time phase order based on electrocardiographic information also obtained from the patient; and
an image reconstruction unit configured to reconstruct three-dimensional cine image data based on the plural pieces of data for imaging sorted in cardiac time phase order after motion correction.

2. A magnetic resonance imaging apparatus comprising:
a data acquisition unit configured to acquire from a patient plural pieces of data for imaging and plural pieces of projection data used to obtain respectively corresponding data related to respiratory motion of the patient by continuously applying a radio frequency pulse train to the patient, said pulse train having a constant repetition time (TR) interval, and both the plural data for imaging and the plural pieces of projection data being acquired asynchronously with cardiac time phase;
a data sorting unit configured to sort the plural pieces of data for imaging into a cardiac time phase order based on electrocardiographic information also obtained from the patient;
a correction unit configured to perform motion correction of the plural pieces of data for imaging sorted in cardiac time phases using the respiratory motion-related data obtained based on the plural pieces of projection data; and
an image reconstruction unit configured to reconstruct three-dimensional image data based on the plural pieces of data for imaging sorted in cardiac time phase order after motion correction.

3. A magnetic resonance imaging apparatus of claim 1, wherein said data acquisition unit is configured to apply gradient magnetic fields to the patient so as to share a common gradient magnetic field pulse with imaging sequences used for acquiring the plural pieces of imaging and projection data.

4. A magnetic resonance imaging apparatus of claim 1, wherein said data acquisition unit is configured to apply the radio frequency pulse train to the patient so as to share a common radio frequency pulse with imaging sequences used for acquiring the plural pieces of imaging and projection data.

5. A magnetic resonance imaging apparatus of claim 1, wherein said data acquisition unit is configured to acquire the plural pieces of imaging and projection data separately for each of respectively corresponding plural segments in k-space.

6. A magnetic resonance imaging apparatus of claim 1, further comprising:
- a data extracting unit configured to extract pieces of data each acquired in a state where respiratory motion of the patient is within a predetermined range,
- wherein said image reconstruction unit is configured to reconstruct the three-dimensional image data based on extracted pieces of data sorted in cardiac time phase order after motion correction.

7. A magnetic resonance imaging apparatus of claim 1,
- wherein said data acquisition unit is configured to acquire the pieces of data using a pulse sequence which acquires projection data representing electrocardiographic information of the patient, and
- said data sorting unit is configured to sort the pieces of data in cardiac time phase order based on electrocardiographic information obtained.

8. A magnetic resonance imaging apparatus of claim 1,
- wherein said data acquisition unit is configured to acquire the pieces of data using a Steady-State Free Precession imaging sequence in applying the radio frequency pulse train to the patient so as to keep a steady state of magnetization in the patient.

9. A magnetic resonance imaging apparatus of claim 1,
- wherein said correction unit is configured to perform motion correction during acquisition of the plural pieces of the imaging and projection data.

10. A magnetic resonance imaging method comprising:
- acquiring from a patient plural pieces of data for imaging and plural pieces of projection data used to obtain respectively corresponding data related to respiratory motion of the patient by continuously applying a radio frequency pulse train to the patient, said pulse train having a constant repetition time (TR) interval, and both the plural data for imaging and the plural pieces of projection data being acquired asynchronously with cardiac time phase;
- performing motion correction of the plural pieces of data for imaging using the respiratory motion-related data obtained based on the plural pieces of projection data;
- sorting the plural pieces of data for imaging after motion correction into a cardiac time phase order based on electrocardiographic information of the patient; and
- reconstructing three-dimensional image data based on the plural pieces of data for imaging sorted in cardiac time phase order after motion correction.

11. A magnetic resonance imaging method comprising:
- acquiring from a patient plural pieces of data for imaging and plural pieces of projection data used to obtain respectively corresponding data related to respiratory motion of the patient by continuously applying a radio frequency pulse train to the patient, said pulse train having a constant repetition time (TR) interval, and both the plural data for imaging and the plural pieces of projection data being acquired asynchronously with cardiac time phase;
- sorting the plural pieces of data for imaging into a cardiac time phase order based on electrocardiographic information of the patient;
- performing motion correction of the plural pieces of data for imaging sorted in cardiac time phase order using the respiratory motion-related data obtained based on the plural pieces of projection data; and
- reconstructing three-dimensional image data based on the plural pieces of data for imaging sorted in cardiac time phase order after motion correction.

12. A magnetic resonance imaging method of claim 10,
- wherein gradient magnetic fields are applied to the patient so as to share a common gradient magnetic field pulse with imaging sequences used for acquiring the plural pieces of imaging and projection parts data.

13. A magnetic resonance imaging method of claim 10,
- wherein the radio frequency pulse train is applied to the patient so as to share a common radio frequency pulse with imaging sequences used for acquiring the plural pieces of imaging and projection data.

14. A magnetic resonance imaging method of claim 10,
- wherein the plural pieces of data are acquired separately for each of respectively corresponding plural segments of k-space.

15. A magnetic resonance imaging method of claim 10, further comprising:
- extracting pieces of data each acquired in a state where respiratory motion of the patient is within a predetermined range,
- wherein the three-dimensional image data is reconstructed based on extracted pieces of data sorted in cardiac time phase order after motion correction.

16. A magnetic resonance imaging method of claim 10,
- wherein the pieces of data are acquired using a pulse sequence to acquire projection data representing the electrocardiographic information of the patient; and
- the pieces of data are sorted in cardiac time phase order based on electrocardiographic information.

17. A magnetic resonance imaging method of claim 10,
- wherein the pieces of data are acquired using a Steady-State Free Precession sequence applying the radio frequency pulse train to the patient so as to keep a steady state of magnetization in the patient.

18. A magnetic resonance imaging method of claim 10,
- wherein motion correction is performed during acquisition of the plural pieces of imaging and projection data.

* * * * *